(12) United States Patent
Park

(10) Patent No.: US 12,046,270 B2
(45) Date of Patent: Jul. 23, 2024

(54) MEMORY AND OPERATION METHOD OF THE SAME

(71) Applicant: SK hynix Inc., Gyeonggi-do (KR)

(72) Inventor: Nak Kyu Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 142 days.

(21) Appl. No.: 17/847,670

(22) Filed: Jun. 23, 2022

(65) Prior Publication Data

US 2023/0267984 A1 Aug. 24, 2023

(30) Foreign Application Priority Data

Feb. 23, 2022 (KR) ........................ 10-2022-0023576

(51) Int. Cl.
*G11C 11/406* (2006.01)
*G11C 11/4096* (2006.01)

(52) U.S. Cl.
CPC .. *G11C 11/40618* (2013.01); *G11C 11/40603* (2013.01); *G11C 11/40615* (2013.01); *G11C 11/4096* (2013.01)

(58) Field of Classification Search
CPC .............................................. G11C 11/40618
USPC ......................................................... 365/222
See application file for complete search history.

(56) References Cited

U.S. PATENT DOCUMENTS

2013/0028038 A1* 1/2013 Fujisawa ........... G11C 11/40615
365/222
2019/0287608 A1 9/2019 Nakanishi

FOREIGN PATENT DOCUMENTS

KR 10-1873526 B1 7/2018

* cited by examiner

*Primary Examiner* — Hoai V Ho
(74) *Attorney, Agent, or Firm* — IP & T GROUP LLP

(57) ABSTRACT

A memory includes: a plurality of memory banks suitable for storing data; a read peripheral region including circuits suitable for transferring data that are read from one memory bank among the memory banks to a memory controller during a read operation; a write peripheral region including circuits suitable for transferring write data that are transferred from the memory controller to one memory bank among the memory banks during a write operation; and a self-refresh counter circuit suitable for activating a self-refresh read signal for activating the read peripheral region whenever a self-refresh operation is performed N times, where N is an integer equal to or greater than 1.

17 Claims, 7 Drawing Sheets

MEMORY AND OPERATION METHOD OF THE SAME

CROSS-REFERENCE TO RELATED APPLICATIONS

The present application claims priority to Korean Patent Application No. 10-2022-0023576, filed on Feb. 23, 2022, which is incorporated herein by reference in its entirety.

BACKGROUND

1. Field

Various embodiments of the present invention relate to a memory.

2. Description of the Related Art

A memory cell of the memory is formed of a transistor that serves as a switch and a capacitor that stores electric charges (data). Data 'high' (logic 1) and 'low' (logic 0) are determined according to whether or not there is a charge in the capacitor of a memory cell, that is, whether the terminal voltage of the capacitor is high or low.

Since data are stored in the form of electric charges being accumulated in a capacitor, there is no power consumption theoretically. However, since the initial amount of charges stored in a capacitor may get lost due to current leakage that may be caused by a PN coupling of a MOS transistor, data may be lost. In order to prevent the loss of data, the data in the memory cell need to be read and the normal amount of charges should be recharged according to the read information before the data get lost. This operation has to be repeated periodically to retain the data. This process of recharging cell charges is called a refresh operation.

The refresh operation may be divided into an auto-refresh operation which is performed whenever a refresh command is applied from the memory controller to a memory, and a self-refresh operation which is performed in the memory by itself when the memory controller just sets a refresh section.

SUMMARY

Embodiments of the present invention are directed to a technique capable of reducing deterioration of operation parameters that may occur due to DC stress of a memory.

In accordance with an embodiment of the present invention, a memory includes: a plurality of memory banks suitable for storing data; a read peripheral region including circuits suitable for transferring data that are read from one memory bank among the memory banks to a memory controller during a read operation; a write peripheral region including circuits suitable for transferring write data that are transferred from the memory controller to one memory bank among the memory banks during a write operation; and a self-refresh counter circuit suitable for activating a self-refresh read signal for activating the read peripheral region whenever a self-refresh operation is performed N times, where N is an integer equal to or greater than 1.

In accordance with another embodiment of the present invention, a method for operating a memory includes: detecting that refresh operations are performed a first predetermined number of times; and operating a read peripheral region for transferring data that are read from a memory bank to a memory controller in response to the detection of the commands of performing the refresh operations the first predetermined times, wherein a read operation is not performed on the memory bank during the operation of the read peripheral region.

In accordance with yet another embodiment of the present invention, a memory includes: a memory bank suitable for outputting data read therefrom in response to a read command applied from a memory controller and storing write data therein in response to a write command applied from the memory controller; a read peripheral region including circuits and configured to be activated, in response to the read command, to transfer the read data from the memory bank to the memory controller; and a write peripheral region including circuits and configured to be activated, in response to the write command, to transfer the write data from the memory controller to the memory bank, wherein the read peripheral region is further configured to be periodically activated even though the read command is not applied.

In accordance with still another embodiment of the present invention, a memory includes: one or more banks each including memory cells; a transfer circuit configured to transfer data between an external and any of the banks; and a control circuit configured to activate, without an access to the memory cells, the transfer circuit at each X number of times that a refresh operation is performed on any of the banks, wherein the transfer circuit includes: a converting circuit configured to parallel-to-serial convert the data from any of the banks to produce serial read data or configured to serial-to-parallel convert the data from the external to produce parallel write data to be stored in any of the memory cells; a providing circuit configured to provide the serial read data to the external or configured to receive the data from the external; and a timing control circuit configured to control operation timings of the converting circuit and the providing circuit.

DETAILED DESCRIPTION

Figure 1:
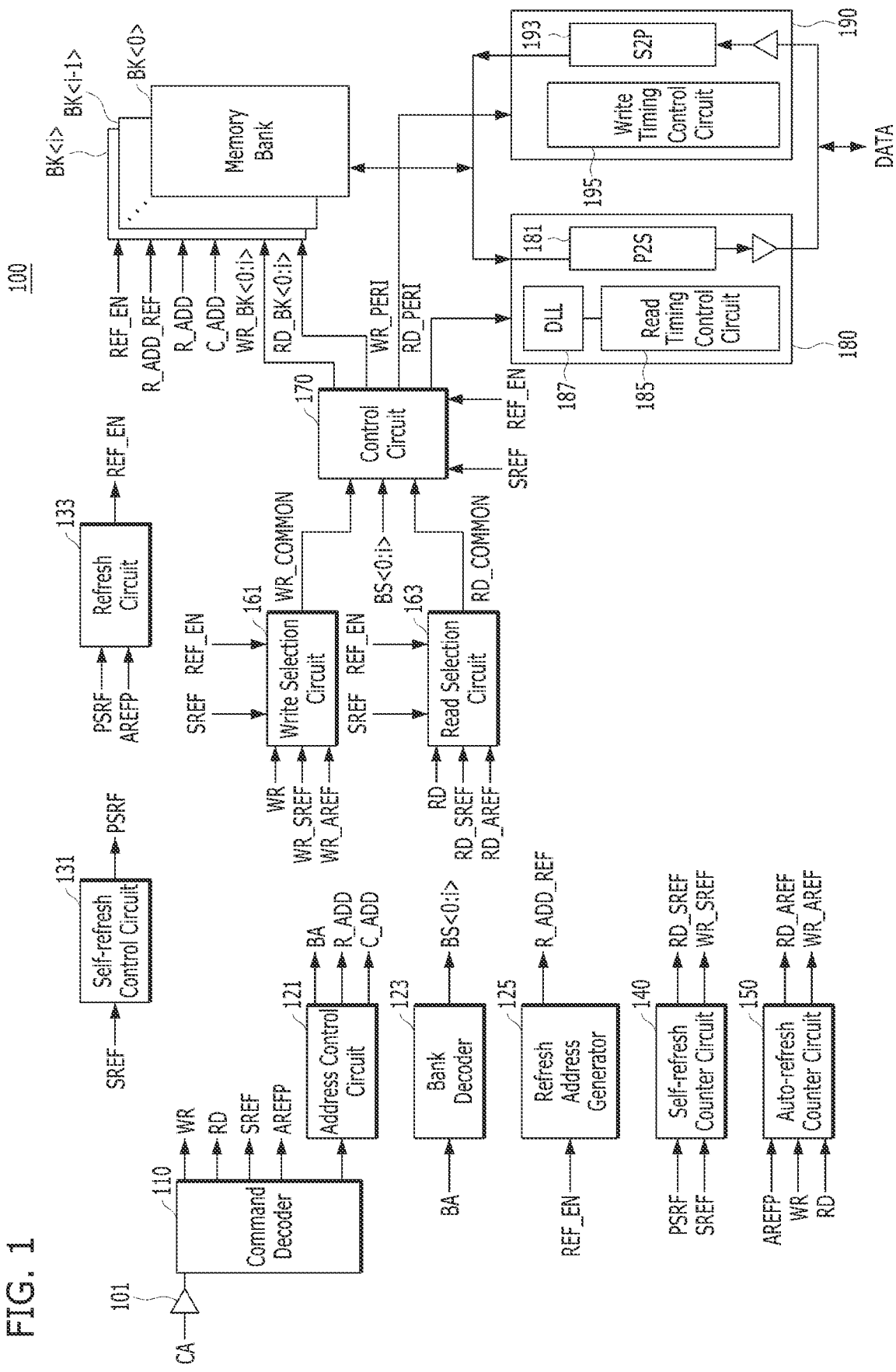
FIG. 1 is a block diagram illustrating a memory in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 1 is a block diagram illustrating a memory 100 in accordance with an embodiment of the present invention.

Referring to FIG. 1, the memory 100 may include a command address receiving circuit 101, a command decoder 110, an address control circuit 121, a bank decoder 123, a refresh address generator 125, a self-refresh control circuit 131, a refresh circuit 133, a self-refresh counter circuit 140, an auto-refresh counter circuit 150, a write selection circuit 161, a read selection circuit 163, a control circuit 170, memory banks BK0 to BKi, a read peripheral region 180, and a write peripheral region 190.

The command address receiving circuit 101 may receive a command and an address CA. Depending on the type of the memory 100, a command and an address may be input to the same input terminals, or they may be input to separate input terminals. Herein, the command and the address are input to the same input terminals. The command and the address CA may be multiple bits.

The command decoder 110 may decode the command and the address to find out what operation the memory controller has commanded the memory 100 to perform. A write signal WR may be a signal which is activated when a write (write) operation is commanded, and a read signal RD may be a signal which is activated when a read operation is commanded. An auto-refresh pulse AREFP may be a pulse signal which is activated when an auto-refresh operation is commanded. A self-refresh signal SREF may be a signal which is activated while a self-refresh operation mode is set by a direction of the memory controller. Other operations commanded by the memory controller to the memory 100 may include an active operation, a precharge operation, a setting operation, and the like, and the command decoder 110 may generate signals related to these operations. However, since these operations are not directly related to the embodiment of the present invention, descriptions of them are omitted herein.

The address control circuit 121 may detect an address received from the command decoder 110 whether the received address is a bank address BA, a row address R_ADD, or a column address C_ADD. The bank address BA may be an address for selecting one memory bank among the memory banks BK0 to BKi, and the row address R_ADD may be an address for selecting one row among the rows in the memory bank. The column address C_ADD may be an address for selecting columns on which a read operation and/or a write operation are to be performed in the memory bank. Each of the addresses BA, R_ADD, and C_ADD may be formed of multiple bits.

The bank decoder 123 may generate bank selection signals BS<0:i> by decoding the bank address BA. The bank decoder 123 may activate a bank selection signal corresponding to a bank which is selected based on the bank address BA among the bank selection signals BS<0:i>. For example, when the value of the bank address BA corresponds to the memory bank BK3, the bank decoder 123 may activate the bank selection signal BS<3>.

The refresh address generator 125 may generate a refresh address R_ADD_REF to be used in an auto-refresh operation and a self-refresh operation. During a refresh operation, the refresh address R_ADD_REF generated inside the memory 100 may be used. The refresh address generator 125 may change the refresh address R_ADD_REF whenever the refresh signal REF_EN is activated. Since only the row address is used in the refresh operation of the memory banks BK0 to BKi, the refresh address R_ADD_REF may be a row address.

The self-refresh control circuit 131 may periodically activate a self-refresh pulse PSRF while the self-refresh signal SREF is activated, that is, in the self-refresh mode.

The refresh circuit 133 may activate the refresh signal REF_EN when the auto-refresh pulse AREFP is activated or the self-refresh pulse PSRF is activated. The refresh signal REF_EN may be a signal commanding a refresh operation of the memory banks BK0 to BKi.

The memory banks BK0 to BKi may be provided for data storage. Each of the memory banks BK0 to BKi may include a cell array including memory cells that are arranged in a plurality of rows and a plurality of columns, a row decoder for activating/deactivating a row of the cell array, and a column decoder for inputting/outputting data from the cell array, and constituent elements for active, precharge, read, write, and refresh operations, such as an input/output circuit. The memory banks BK0 to BKi may perform a write operation of writing data in the memory cells that are selected based on the row address RADD and the column address CADD when the bank write signal WR_BK<0:i> corresponding thereto is activated. For example, when the bank write signal WR_BK<5> is activated, data may be written into the memory cells that are selected based on the row address RADD and the column address C_ADD in the memory bank BK5. The memory banks BK0 to BKi may perform a read operation of reading data from the memory cells that are selected based on the row address RADD and the column address C_ADD when the bank read signal RD_BK<0:i> corresponding thereto is activated. For example, when the bank read signal RD_BK<2> is activated, data may be read from the memory cells that are selected based on the row address RADD and the column address CADD in the memory bank BK2. When the refresh signal REF_EN is activated, a refresh operation may be performed in the memory banks BK0 to BKi. The refresh operation may be simultaneously performed in the memory banks BK0 to BKi, and a row corresponding to the refresh address R_ADD_REF may be refreshed in each of the memory banks BK0 to BKi.

The read peripheral region 180 may be a region for transferring data read from one memory bank among the memory banks BK0 to BKi to the memory controller during a read operation. The read peripheral region 180 may include a parallel-to-serial conversion circuit 181 for parallel-to-serial converting data that are read from one memory bank among a plurality of memory banks to produce serial read data, a data transfer circuit 183 for transferring the serial read data obtained from the parallel-to-serial conversion of the parallel-to-serial conversion circuit 181, and a read timing control circuit 185 for controlling operation timing of the parallel-to-serial conversion circuit 181 and the data transfer circuit 183. Also, the read peripheral region 180 may include a delay locked loop DLL 187. The delay locked loop DLL 187 may generate an internal clock to be used in the read peripheral region 180 during a read operation based on a clock transferred from the memory controller. The read peripheral region 180 may be activated and operates when a peripheral read signal RD_PERI is activated.

The write peripheral region 190 may be a region for transferring write data transferred from the memory controller to one memory bank among the memory banks during a write operation. The write peripheral region 190 may include a data receiving circuit 191 for receiving data DATA transferred from the memory controller, a serial-to-parallel conversion circuit 193 for serial-to-parallel converting the data received by the data receiving circuit 191 to produce parallel data and transferring the parallel data to one memory bank among the memory banks BK0 to BKi, and a write timing control circuit 195 for controlling the operation timing of the data receiving circuit 191 and the serial-to-parallel conversion circuit 193. The write peripheral region 190 may be activated and operate when a peripheral write signal WR_PERI is activated.

During a read operation of the memory 100, one memory bank among the memory banks BK0 to BKi and the read peripheral region 180 may operate, and during a write operation of the memory 100, one memory bank among the memory banks BK0 to BKi and the write peripheral region 190 may operate. Also, during a refresh operation, the memory banks BK0 to BKi may operate. Since the refresh operation is an operation which is performed periodically, the memory banks BK0 to BKi may continue to operate periodically. On the other hand, the read operation and the write operation are operations that are performed irregularly, and when a system including the memory 100 is idle, the read operation and the write operation may not be performed for a long period of time. The read peripheral region 180 and the write peripheral region 190 may be deactivated without operating for a long time. When transistors are not turned on/off but kept on in a turned-on state or in a turned-off state, the transistors may be deteriorated due to DC stress. The deteriorated transistors may change the operation parameters of the circuit including the transistors. When the read peripheral region 180 and the write peripheral region 190 do not operate for a long period of time, the operation parameters of the read peripheral region 180 and the write peripheral region 190 may be deteriorated. Since the operation margins of the read peripheral region 180 and the write peripheral region 190 are in the unit of ps (picosecond), deterioration of the operation parameters may result in deterioration of the quality of the memory 100.

To prevent the operation parameters of the read peripheral region 180 and the write peripheral region 190 from being deteriorated, a method of periodically operating the read peripheral region 180 and the write peripheral region 190 may be used. Periodically operating the read peripheral region 180 and the write peripheral region 190 may require a self-refresh counter circuit 140, an auto-refresh counter circuit 150, a write selection circuit 161, a read selection circuit 163, and a control circuit 170, which will be described below.

The self-refresh counter circuit 140 may activate the self-refresh read signal RD_SREF whenever the self-refresh operation is performed N times, where N is an integer equal to or greater than 1, and whenever the self-refresh operation is performed M times, where M is an integer equal to or greater than 1, the self-refresh counter circuit 140 may activate the self-refresh write signal WR_SREF. Herein, N and M may be the same number. The self-refresh read signal RD_SREF may be a signal for operating the read peripheral region 180, and the self-refresh write signal WR_SREF may be a signal for operating the write peripheral region 190. Accordingly, the read peripheral region 180 may operate one time whenever the self-refresh operation is performed N times, and whenever the self-refresh operation is performed M times, the write peripheral region 190 may operate one time. The self-refresh counter circuit 140 will be described in detail later with reference to FIG. 2.

The auto-refresh counter circuit 150 may activate the auto-refresh read signal RD_AREF whenever the auto-refresh operation is performed K times, where K is an integer equal to or greater than 1, and the auto-refresh counter circuit 150 may activate the auto-refresh write signal WR_AREF whenever the auto-refresh operation is performed L times, where L is an integer equal to or greater than 1. Here, K and L may be the same number. The auto-refresh read signal RD_AREF may be a signal for operating the read peripheral region 180, and the auto-refresh write signal WR_AREF may be a signal for operating the write peripheral region 190. Accordingly, the read peripheral region 180 may operate one time whenever the auto-refresh operation is performed K times, and the write peripheral region 190 may operate one time whenever the auto-refresh operation is performed L times. The auto-refresh counter circuit 150 will be described in detail later with reference to FIG. 4.

The write selection circuit 161 may select one among the write signal WR, the self-refresh write signal WR_SREF, and the auto-refresh write signal WR_AREF to output the selected signal as a common write signal WR_COMMON. The write selection circuit 161 may output the self-refresh write signal WR_SREF as the common write signal WR_COMMON in a self-refresh operation section, and the write selection circuit 161 may output the auto-refresh write signal WR_AREF as the common write signal WR_COMMON in the auto-refresh operation section. In a section which is not a refresh operation section, it may output the write signal WR as the common write signal WR_COMMON.

The read selection circuit 163 may select one among the read signal RD, the self-refresh read signal RD_SREF, and the auto-refresh read signal RD_AREF and output the selected signal as a common read signal RD_COMMON. The read selection circuit 163 may output the self-refresh read signal RD_SREF as the common read signal RD_COMMON in a self-refresh operation section, and output the auto-refresh read signal RD_AREF as the common read signal RD_COMMON in an auto-refresh operation section. In a section which is not a refresh operation section, it may output the read signal RD as the common read signal RD_COMMON. The write selection circuit 161 and the read selection circuit 163 will be described in detail later with reference to FIG. 6.

When the activation of the common write signal WR_COMMON is caused by the application of the write command, the control circuit 170 may activate one among the bank write signals WR_BK<0:i> and the peripheral write signal WR_PERI. Also, when the activation of the common read signal RD_COMMON is caused by the application of the read command, the control circuit 170 may activate one among the bank read signals RD_BK<0:i> and the peripheral read signal RD_PERI. However, when the activation of the common write signal WR_COMMON is not caused by the application of the write command, the control circuit 170 may deactivate all the bank write signals WR_BK<0:i> and activate the peripheral write signal WR_PERI. Similarly, when the activation of the common read signal RD_COMMON is not caused by the application of the read command, the control circuit 170 may deactivate all the bank read signals RD_BK<0:i> and activate the peripheral read signal RD_PERI. The control circuit 170 will be described in detail later with reference to FIG. 7.

When one among the bank write signals VR_BK<0:i> and the peripheral write signal WR_PERI are activated, a write operation in which write data DATA transferred from the memory controller are written into a selected memory bank may be performed. Also, when one among the bank read signals RD_BK<0:i> and the peripheral read signal RD_PERI are activated, a read operation in which data DATA read from the selected memory bank are transferred to the memory controller may be performed.

When the bank write signals WR_BK<0:i> are all deactivated and the peripheral write signal WR_PERI is activated, only the write peripheral region 190 may be activated and operate, and no data DATA are written into the memory bank BK0 to BKi, Only the write peripheral region 190 is activated and operates and data DATA are not transferred from the memory controller to the memory 100 and not stored in the memory banks BK0 to BKi, either. Therefore, a write operation is not actually performed, and no problem may be caused in the operation of the memory 100. When all of the bank read signals RD_BK<0:i> are deactivated and the peripheral read signal RD_PERI is activated, only the read peripheral region 180 may be activated and operate, and no data may be read from the memory banks BK0 to BKi. Also, since it is not a read operation section, the memory controller may also ignore the data DATA transferred from the read peripheral region 180. Therefore, no problem may be caused in the operation of the memory 100 and the memory controller as well, FIG. 2 is a block diagram illustrating a self-refresh counter circuit 140 shown in FIG. 1 in accordance with an embodiment of the present invention, and FIG. 3 is an operation timing diagram of the self-refresh counter circuit 140 in accordance with an embodiment of the present invention.

Figure 2:
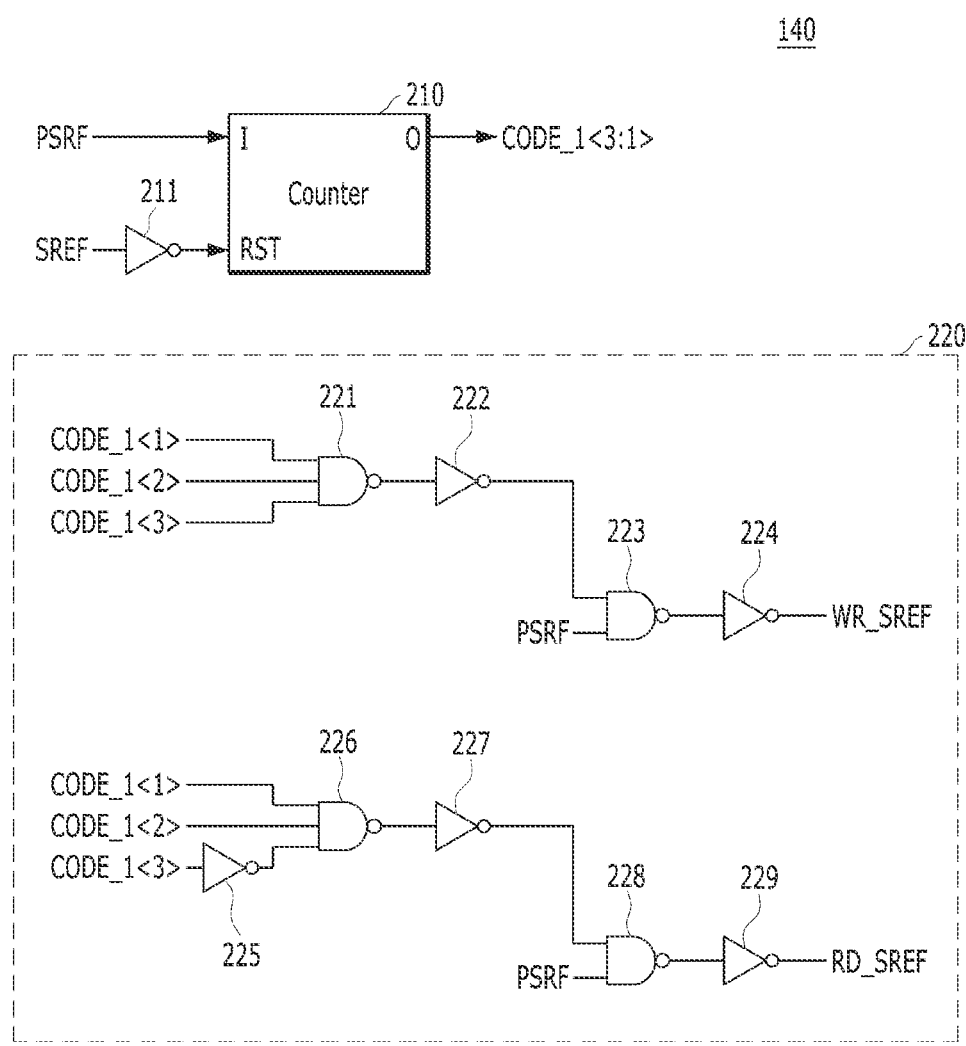
FIG. 2 is a block diagram illustrating a self-refresh counter circuit shown in FIG. 1 in accordance with an embodiment of the present invention.
Figure 3:
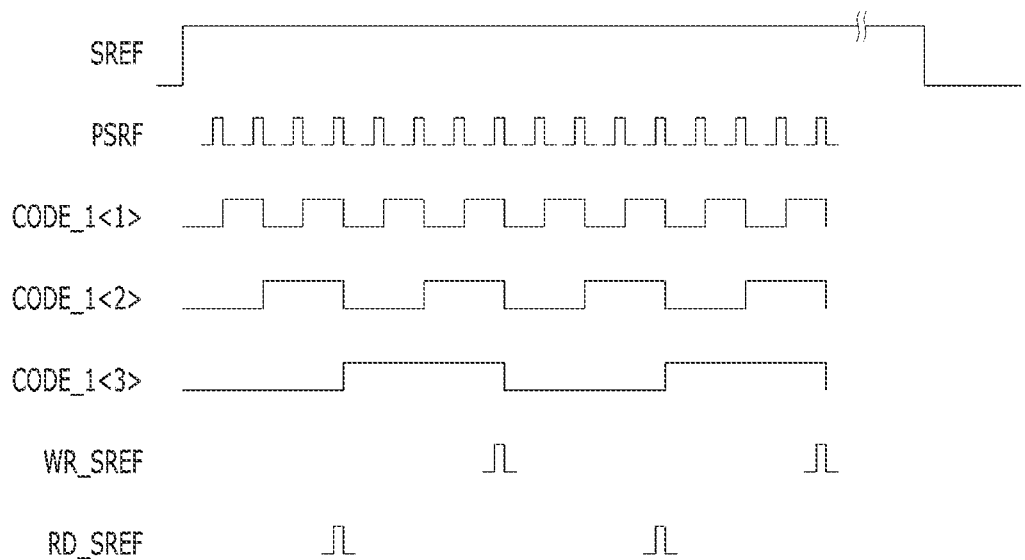
FIG. 3 is an operation timing diagram of the self-refresh counter circuit in accordance with an embodiment of the present invention.

Referring to FIG. 2, the self-refresh counter circuit 140 may include a counter 210 and a logic circuit 220.

The counter 210 may generate a first code CODE_1<3:1> by counting the number of times that the self-refresh puke PSRF is activated, which may be simply referred to as the activation number of the self-refresh puke PSRF. The counter 210 may receive the self-refresh signal SREF at a reset terminal RST through an inverter 211. When the self-refresh signal SREF is deactivated to a low level, the first code CODE_1<3:1> may be initialized.

The logic circuit 220 may activate the self-refresh read signal RD_SREF when the value of the first code CODE_1<3:1> is '3', and when the value of the first code CODE_1<3:1> is '7', the logic circuit 220 may activate the self-refresh write signal WR_SREF. The value of the first code CODE_1<3:1> may change like 0, 1, 2, 3, 4, 5, 6, 7, 0, 1, 2, 3 whenever the self-refresh pulse PSRF is activated. Therefore, whenever the self-refresh pulse PSRF is activated eight times, the self-refresh read signal RD_SREF and the self-refresh write signal WR_SREF may be activated once.

The logic circuit 220 may include NAND gates 221, 223, 226, and 228, and inverters 222, 224, 225, 227, and 229. When the value of the first code CODE_1<3:1> is '3'=(0, 1, 1) and the self-refresh pulse PSRF is at a high level, the self-refresh read signal RD_SREF which is output from the inverter 229 may be activated to a high level. Also, when the value of the first code CODE_1<3:1> is '7'=(1, 1, 1) and the self-refresh pulse PSRF is at a high level, the self-refresh write signal WR_SREF which is output from the inverter 224 may be activated to a high level.

Referring to FIG. 3, it may be seen that when the value of the first code CODE_1<3:1> is '3'=(0, 1, 1) and the self-refresh pulse PSRF is activated, the self-refresh read signal RD_SREF may be activated to a high level, and when the value of the first code CODE_1<3:1> is '7'=(1, 1, 1) and the self-refresh pulse PSRF is activated, the self-refresh write signal WR_SREF may be activated to a high level.

Figure 4:
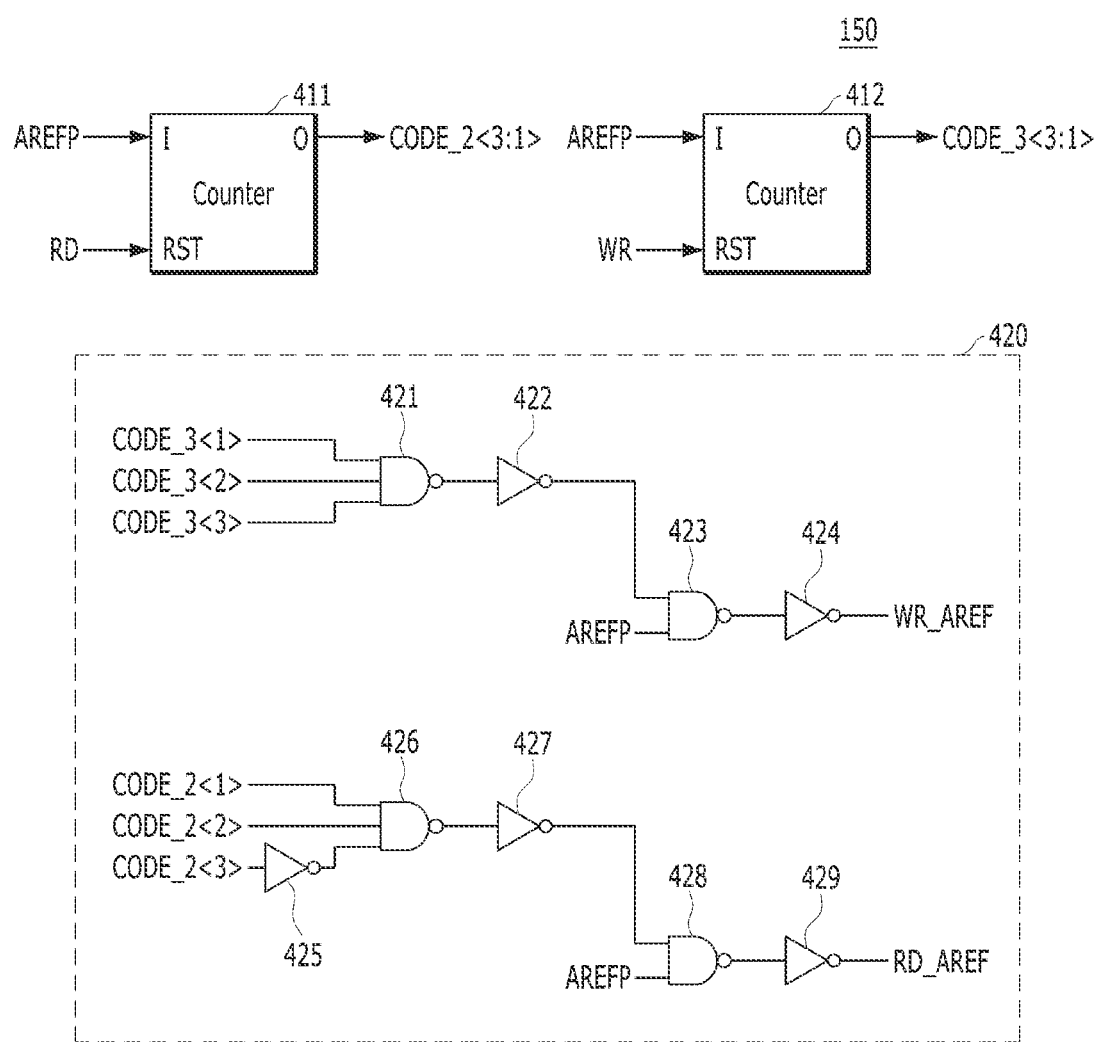
FIG. 4 is a block diagram illustrating an auto-refresh counter circuit shown in FIG. 1 in accordance with an embodiment of the present invention.
Figure 5:
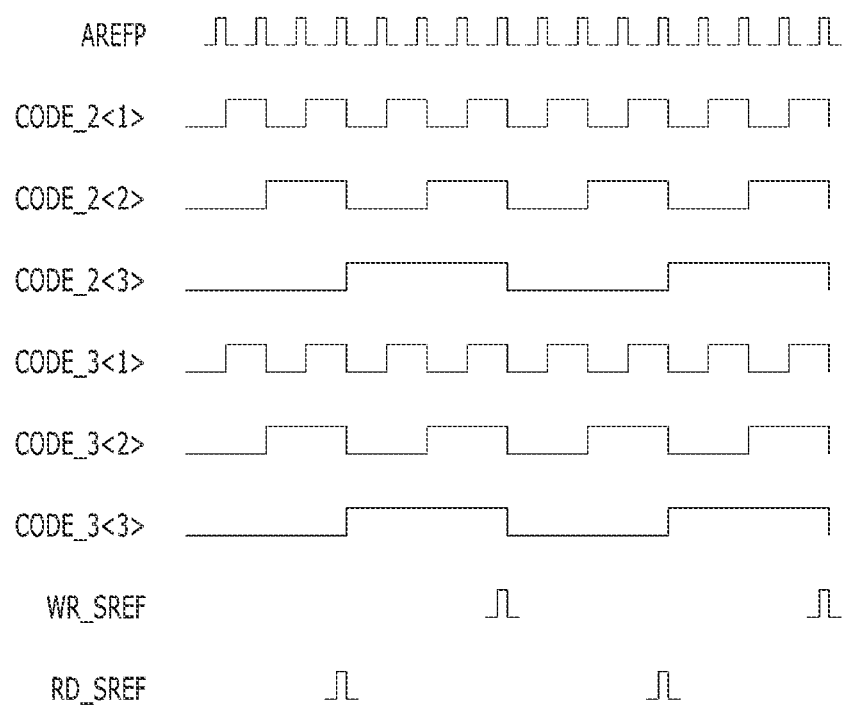
FIG. 5 is an operation timing diagram of the auto-refresh counter circuit in accordance with an embodiment of the present invention.

FIG. 4 is a block diagram illustrating the auto-refresh counter circuit 150 shown in FIG. 1 in accordance with an embodiment of the present invention, FIG. 5 is an operation timing diagram of the auto-refresh counter circuit 150 in accordance with an embodiment of the present invention.

Referring to FIG. 4, the auto-refresh counter circuit 150 may include counters 411 and 412 and a logic circuit 420.

The counter 411 may generate a second code CODE_2<3:1> by counting the number of times that the auto-refresh pulse AREFP is activated, which may be simply referred to as the activation number of the auto-refresh pulse AREFP. The counter 411 may receive the read signal RD at a reset terminal RST. When the read signal RD is activated to a high level, the value of the second code CODE_2<3:1> may be initialized. This is because the activation of the read signal RD may mean that the read peripheral region 180 is activated and, in this case, there is no need to additionally activate the read peripheral region 180 (which requires wasting current) during an auto-refresh operation.

The counter 412 may generate a third code CODE_3<3:1> by counting the number of times that the auto-refresh pulse AREFP is activated, which may be simply referred to as the activation number of the auto-refresh pulse AREFP. The counter 412 may receive the write signal WR at a reset terminal RST. When the write signal WR is activated to a high level, the value of the third code CODE_3<3:1> may be initialized. This is because the activation of the write signal WD may mean that the write peripheral region 190 is activated and, in this case, there is no need to additionally activate the write peripheral region 190 (which requires wasting current) during an auto-refresh operation.

The logic circuit 420 may activate the auto-refresh read signal RD_AREF when the value of the second code CODE_2<3:1> is '3', and when the value of the third code CODE_3<3:1> is '7', the logic circuit 420 may activate the auto-refresh write signal WR_AREF. Each of the value of the second code CODE_2<3:1> and the value of the third code CODE_3<3:1> may change like 0, 1, 2, 3, 4, 5, 6, 7, 0, 1, 2, 3, . . . whenever the auto-refresh pulse AREFP is activated. Therefore, the auto-refresh read signal RD_AREF and the auto-refresh write signal WR_AREF may be activated once whenever the auto-refresh pulse AREFP is activated eight times.

The logic circuit 420 may include NAND gates 421, 423, 426, and 428, and inverters 422, 424, 425, 427, and 429. When the second code CODE_2<3:1> is '3'=(0, 1, 1) and the auto-refresh pulse AREFP is at a high level, the auto-refresh read signal RD_AREF which is output from the inverter 429 may be activated to a high level. Also, when the third code CODE_3<3:1> is '7'=(1, 1, 1) and the auto-refresh pulse AREFP is at a high level, the auto-refresh write signal WR_AREF may be activated to a high level.

Referring to FIG. 5, it may be seen that when the value of the second code CODE_2<3:1> is '3'=(0, 1, 1) and the auto-refresh pulse AREFP is activated, the auto-refresh read signal RD_AREF may be activated to a high level, and when the value of the third code CODE_3<3:1> is '7'=(1, 1, 1) and the auto-refresh pulse AREFP is activated, the auto-refresh write signal WR_AREF may be activated to a high level. It is illustrated in FIG. 5 that the second code CODE 2<3:1> and the third code CODE_3<3:1> have the same value. However, when the read signal RD is activated and thus the second code CODE_2<3:1> is initialized or when the write signal WR is activated and the third code CODE_3<3:1> is initialized in the middle of an operation, the second code CODE_2<3:1> and the third code CODE_3<3:1>) may have different values, FIG. 6 is a block diagram illustrating the write selection circuit 161 and the read selection circuit 163 shown in FIG. 1 in accordance with an embodiment of the present invention.

Figure 6:
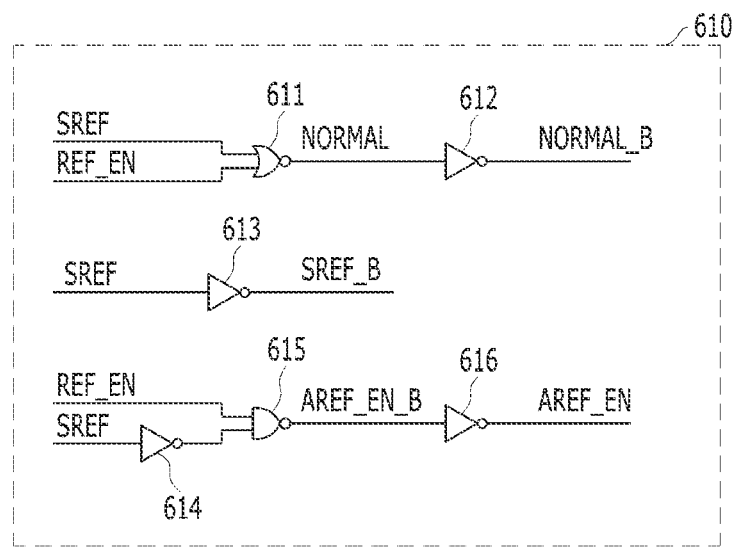
FIG. 6 is a block diagram illustrating a write selection circuit 161 and a read selection circuit shown in FIG. 1 in accordance with an embodiment of the present invention.
Figure 6:
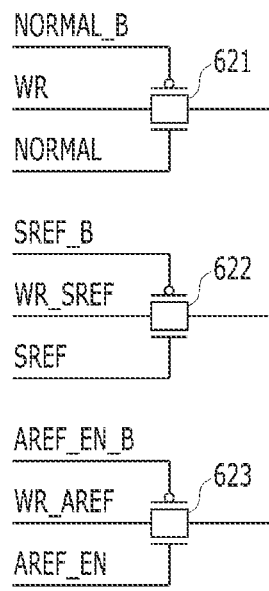
Figure 6:
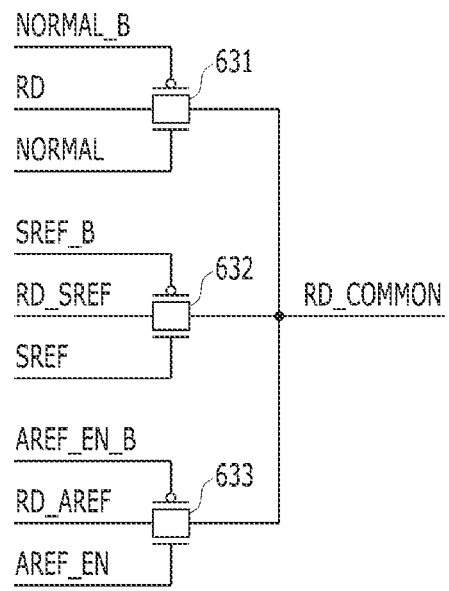

Referring to FIG. 6, the write selection circuit 161 may include a logic circuit 610 and path gates 621, 622, and 623.

The logic circuit 610 may include a NOR gate 611, inverters 612, 613, 614, and 616, and a NAND gate 615. When the self-refresh signal SREF and the refresh signal REF_EN are deactivated to a low level, the logic circuit 610 may generate a normal signal NORMAL of a high level and an inverted normal signal NORMAL_B of a low level. The fact that the normal signal NORMAL is activated to a high level may indicate that it is a section where a self-refresh operation and an auto-refresh operation are not performed.

The inverter 613 of the logic circuit 610 may invert the self-refresh signal SREF to generate an inverted self-refresh signal SREF_B. The fact that the self-refresh signal SREF is activated to a high level may indicate that it is a self-refresh operation section.

When the refresh signal REF_EN is at a high level and the self-refresh signal SREF is at a low level, the logic circuit 610 may be able to generate an auto-refresh enable signal AREF_EN of a high level, and an inverted auto-refresh enable signal AREF_EN_B of a low level. The fact that the auto-refresh enable signal AREF_EN is activated to a high level may indicate that it is an auto-refresh operation section.

The path gate 621 may be turned on when the normal signal NORMAL is activated and output the write signal WR as a common write signal WR_COMMON. The path gate 622 may be turned on when the self-refresh signal SREF is activated and output the self-refresh write signal WR_SREF as the common write signal WR_COMMON. Also, the path gate 623 may be turned on when the auto-refresh enable signal AREF_EN is activated and output the auto-refresh write signal WR_AREF as the common write signal WR_COMMON. In the self-refresh operation mode, the self-refresh write signal WR_SREF may be output as the common write signal WR_COMMON, and in the auto-refresh operation section, the auto-refresh write signal WR_AREF may be output as the common write signal WR_COMMON. In an operation section other than a refresh operation, the write signal WR may be output as the common write signal WR_COMMON.

The read selection circuit 163 may include path gates 631, 632, and 633. The path gate 631 may be turned on when the normal signal NORMAL is activated and output the read signal RD as a common read signal RD_COMMON. The path gate 632 may be turned on when the self-refresh signal SREF is activated and output the self-refresh read signal RD_SREF as the common read signal RD_COMMON. Also, the path gate 633 may be turned on when the auto-refresh enable signal AREF_EN is activated and output the auto-refresh read signal RD_AREF as the common read signal RD_COMMON. In the self-refresh operation mode, the self-refresh read signal RD_SREF may be output as the common read signal RD_COMMON, and in the auto-refresh operation section, the auto-refresh read signal RD_AREF may be output as the common read signal RD_COMMON. In an operation section other than a refresh operation, the read signal RD may be output as the common read signal RD_COMMON.

Figure 7:
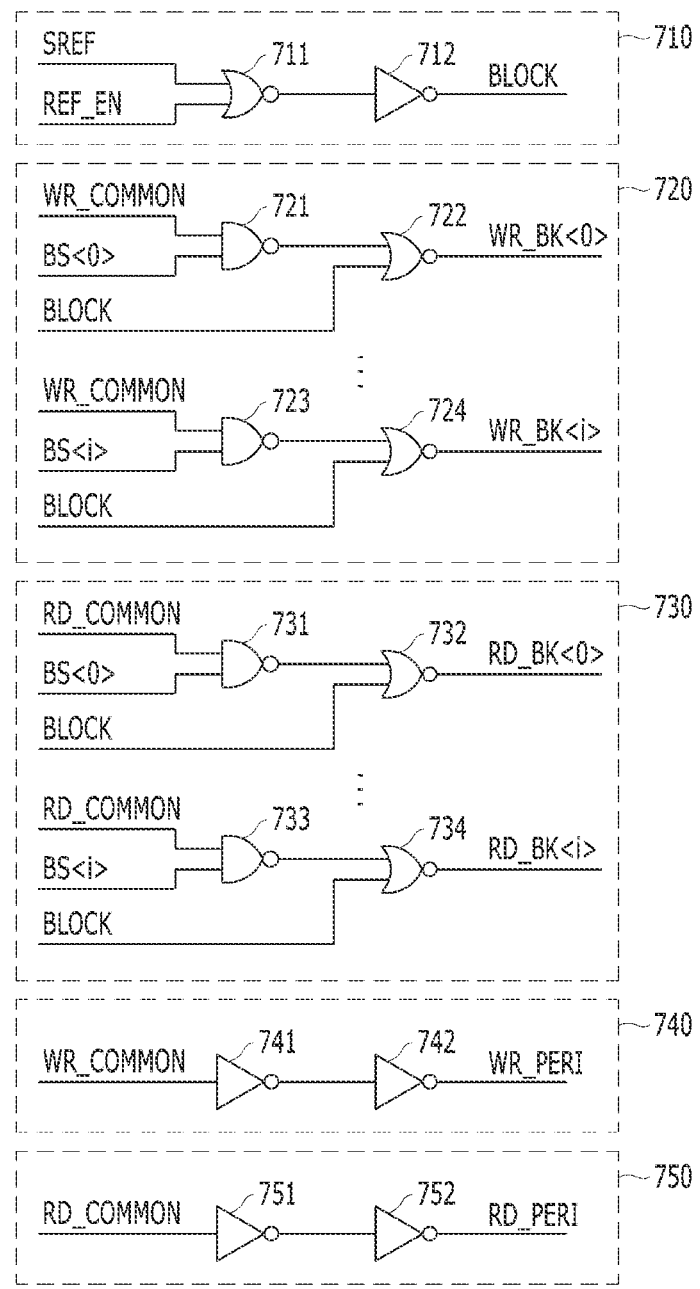
FIG. 7 is a block diagram illustrating a control circuit shown in FIG. 1 in accordance with an embodiment of the present invention.

FIG. 7 is a block diagram illustrating the control circuit 170 shown in FIG. 1 in accordance with an embodiment of the present invention.

Referring to FIG. 7, the control circuit 170 may include a block signal generator 710, a bank write signal generator 720, a bank read signal generator 730, a peripheral write signal generator 740, and a peripheral read signal generator 750.

The block signal generator 710 may include a NOR gate 711 and an inverter 712. The block signal generator 710 may activate a block signal BLOCK to a high level when the self-refresh signal SREF is activated or the refresh signal REF_EN is activated. When the memory 100 is in the middle of a refresh operation, the block signal BLOCK may be activated.

The bank write signal generator 720 may include NAND gates 721 and 723 and NOR gates 722 and 724. When the common write signal WR_COMMON is activated while the block signal BLOCK is deactivated to a low level, the bank write signal WR_BK<0:i> corresponding to the activated bank selection signal among the bank selection signals BS<0:i> may be activated. For example, when the common write signal WR_COMMON and the bank selection signal BS<4> are activated, the bank write signal WR_BK<4> may be activated. However, when the block signal BLOCK is activated to a high level, all the bank write signals WR_BK<0:i> may not be activated. When the common write signal WR_COMMON is activated during a refresh operation, a write operation may not be performed in the memory banks BK0 to BKi.

The bank read signal generator 730 may include NAND gates 731 and 733 and NOR gates 732 and 734. When the common read signal RD_COMMON is activated while the block signal BLOCK is deactivated to a low level, the bank read signal RD_BK<0:i> corresponding to the activated bank selection signal among the bank selection signals BS<0:i> may be activated. For example, when the common read signal RD_COMMON and the bank selection signal BS<2> are activated, the bank read signal RD_BK<2> may be activated. However, when the block signal BLOCK is activated to a high level, all the bank read signals RD_BK<0:i> may not be activated. When the common read signal RD_COMMON is activated in the middle of the refresh operation, a read operation may not be performed in the memory banks BK0 to BKi.

The peripheral write signal generator 740 may include inverters 741 and 742. When the common write signal WR_COMMON is activated to a high level, the peripheral write signal WR_PERI may be activated to a high level.

The peripheral read signal generator 750 may include inverters 751 and 752. When the common read signal RD_COMMON is activated to a high level, the peripheral read signal RD_PERI may be activated to a high level.

According to the embodiments of the present invention, even though a read command is not applied to the memory 100, the read peripheral region 180 may be activated and operate periodically, and even though a write command is not applied to the memory 100, the write peripheral region 180 may be activated and operate periodically. Therefore, it is possible to prevent deterioration of operation parameters originating from DC stress that may occur because the read peripheral region 180 does not operate for a long time and deterioration of operation parameters originating from DC stress that may occur because the write peripheral region 190 does not operate for a long time.

According to an embodiment of the present invention, deterioration of operation parameters that may occur due to DC stress of a memory may be reduced.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory, comprising:
a plurality of memory banks suitable for storing data;
a read peripheral region including circuits suitable for transferring data that are read from one memory bank among the memory banks to a memory controller during a read operation;
a write peripheral region including circuits suitable for transferring write data that are transferred from the memory controller to one memory bank among the memory banks during a write operation; and
a self-refresh counter circuit suitable for activating a self-refresh read signal for activating the read peripheral region whenever a self-refresh operation is performed N times, where N is an integer equal to or greater than 1.

2. The memory of claim 1, wherein the self-refresh counter circuit is further suitable for activating a self-refresh write signal for activating the write peripheral region whenever the self-refresh operation is performed M times, where M is an integer equal to or greater than 1.

3. The memory of claim 2, further comprising an auto-refresh counter circuit suitable for activating an auto-refresh read signal for activating the read peripheral region whenever an auto-refresh operation is performed K times, where K is an integer equal to or greater than 1.

4. The memory of claim 3, wherein the auto-refresh counter circuit is further suitable for activating an auto-refresh write signal for activating the write peripheral region whenever the auto-refresh operation is performed L times, where L is an integer equal to or greater than 1.

5. The memory of claim 2, wherein
when the read peripheral region is activated according to the self-refresh read signal, a read operation is not performed on the memory banks, and
wherein when the write peripheral region is activated according to the self-refresh write signal, a write operation is not performed on the memory banks.

6. The memory of claim 4, wherein
when the read peripheral region is activated according to the auto-refresh read signal, a read operation is not performed on the memory banks; and
wherein when the write peripheral region is activated according to the auto-refresh write signal, a write operation is not performed on the memory banks.

7. The memory of claim 1, wherein the read peripheral region includes:
a parallel-to-serial conversion circuit suitable for parallel-to-serial converting the data that are read from one memory bank among the memory banks to produce serial read data;
a data transferring circuit suitable for transferring the serial read data obtained from the parallel-serial conversion in the parallel-to-serial conversion circuit to the memory controller; and
a read timing control circuit suitable for controlling operation timing of the parallel-to-serial conversion circuit and the data transferring circuit.

8. The memory of claim 1, wherein the write peripheral region includes:
a data receiving circuit suitable for receiving the write data transferred from the memory controller;
a serial-to-parallel conversion circuit suitable for serial-to-parallel converting the write data received by the data receiving circuit; and
a write timing control circuit suitable for controlling operation timing of the serial-to-parallel conversion circuit and the data receiving circuit.

9. The memory of claim 7, wherein the read peripheral region further includes a delay locked loop suitable for generating an internal clock based on a clock transferred from the memory controller.

10. The memory of claim 4, further comprising:
a write selection circuit suitable for:
selecting the self-refresh write signal in a self-refresh mode,
selecting the auto-refresh write signal while a refresh operation is performed and the memory is not in a self-refresh mode,
selecting a write signal while a refresh operation is not performed and the memory is not in the self-refresh mode, and
outputting, as a common write signal, the signal selected thereby;
a read selection circuit suitable for
selecting the self-refresh read signal in the self-refresh mode,
selecting the auto-refresh read signal while the refresh operation is performed and the memory is not in the self-refresh mode,
selecting a read signal while a refresh operation is not performed and the memory is not in the self-refresh mode, and
outputting, as a common read signal, the signal selected thereby; and
a control circuit suitable for:
activating a bank write signal of a selected memory bank among the memory banks when the common write signal is activated while a refresh operation is not performed and the memory is not in the self-refresh mode,
activating a peripheral write signal for activating the write peripheral region when the common write signal is activated,
activating a bank read signal of a selected memory bank among the memory banks when the common read signal is activated while a refresh operation is not performed and the memory is not in the self-refresh mode, and
activating a peripheral read signal for activating the read peripheral region when the common read signal is activated.

11. The memory of claim 2, wherein the self-refresh counter circuit includes:
a first counter suitable for generating a first code by counting a number of times that a self-refresh pulse is activated, and initializing the first code when the self-refresh mode is terminated; and
a first logic circuit suitable for activating the self-refresh read signal when the first code has a first value and activating the self-refresh write signal when the first code has a second value.

12. The memory of claim 4, wherein the auto-refresh counter circuit includes:
a second counter suitable for generating a second code by counting a number of times that an auto-refresh pulse is activated and initializing the second code when a write signal is activated;

a third counter suitable for generating a third code by counting the number of times that the auto-refresh pulse is activated and initializing the third code when a read signal is activated; and a second logic circuit suitable for activating the auto-refresh read signal when the second code has a third value and activating the auto-refresh write signal when the second code has a fourth value.

13. A method for operating a memory, comprising:

detecting that refresh operations are performed a first predetermined number of times; and operating a read peripheral region for transferring data that are read from a memory bank to a memory controller in response to the detection of the commands of performing the refresh operations the first predetermined times, wherein a read operation is not performed on the memory bank during the operation of the read peripheral region.

14. The method of claim 13, further comprising:

detecting that the refresh operations are performed a second predetermined number of times; and operating a write peripheral region for transferring write data that are received from the memory controller to the memory bank in response to the detection of the commands of performing the refresh operations the second predetermined times, wherein a write operation is not performed on the memory bank when the write peripheral region is operated.

15. The method of claim 14, wherein the refresh operation is a self-refresh operation.

16. The method of claim 14, wherein the refresh operation is an auto-refresh operation.

17. A memory comprising:

one or more banks each including memory cells;

a transfer circuit configured to transfer data between an external and any of the banks; and a control circuit configured to activate, without an access to the memory cells, the transfer circuit at each X number of times that a refresh operation is performed on any of the banks, wherein the transfer circuit includes:

a converting circuit configured to parallel-to-serial convert the data from any of the banks to produce serial read data or configured to serial-to-parallel convert the data from the external to produce parallel write data to be stored in any of the memory cells;

a providing circuit configured to provide the serial read data to the external or configured to receive the data from the external; and a timing control circuit configured to control operation timings of the converting circuit and the providing circuit.

* * * * *